(12) United States Patent
Shim

(10) Patent No.: US 7,990,194 B2
(45) Date of Patent: Aug. 2, 2011

(54) APPARATUS AND METHOD FOR CORRECTING DUTY CYCLE OF CLOCK SIGNAL

(75) Inventor: Seok-Bo Shim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 37 days.

(21) Appl. No.: 12/630,400

(22) Filed: Dec. 3, 2009

(65) Prior Publication Data

US 2011/0102039 A1 May 5, 2011

(30) Foreign Application Priority Data

Oct. 30, 2009 (KR) .................. 10-2009-0104624

(51) Int. Cl.
*H03L 7/06* (2006.01)
(52) U.S. Cl. ......... 327/158; 327/149; 327/161; 327/175
(58) Field of Classification Search .................. 327/149, 327/158, 161, 172–176
See application file for complete search history.

(56) References Cited

U.S. PATENT DOCUMENTS

| | | | | |
|---|---|---|---|---|
| 5,614,855 A * | 3/1997 | Lee et al. | | 327/158 |
| 6,859,081 B2 * | 2/2005 | Hong et al. | | 327/175 |
| 6,897,693 B2 * | 5/2005 | Kim | | 327/158 |
| 7,020,228 B2 * | 3/2006 | Miyano | | 375/376 |
| 7,598,783 B2 * | 10/2009 | Shin et al. | | 327/158 |
| 7,821,310 B2 * | 10/2010 | Yun et al. | | 327/158 |
| 7,830,187 B2 * | 11/2010 | Chung et al. | | 327/158 |
| 2003/0201806 A1 * | 10/2003 | Cho | | 327/116 |

FOREIGN PATENT DOCUMENTS

| | | |
|---|---|---|
| KR | 1020080075286 | 8/2008 |
| KR | 1020090059676 | 6/2009 |

OTHER PUBLICATIONS

Notice of Allowance issued from Korean Intellectual Property Office on Mar. 29, 2011.

* cited by examiner

*Primary Examiner* — Lincoln Donovan
*Assistant Examiner* — Patrick O'Neill
(74) *Attorney, Agent, or Firm* — IP & T Group LLP

(57) ABSTRACT

A clock correction circuit includes a delay locked loop (DLL) configured to delay an external clock signal and to generate an internal clock signal, a first duty cycle correction (DCC) unit configured to correct a duty cycle of the external clock signal in response to a first duty cycle code, a second DCC unit configured to correct a duty cycle of the internal clock signal in response to a second duty cycle code, and a duty cycle code generation unit configured to select an output of from outputs of the first and second DCC Units and to generate the first and second duty cycle codes by detecting a duty cycle ratio of the selected output.

12 Claims, 3 Drawing Sheets

APPARATUS AND METHOD FOR CORRECTING DUTY CYCLE OF CLOCK SIGNAL

CROSS-REFERENCE TO RELATED APPLICATION

The present application claims priority of Korean Patent Application No. 10-2009-0104624, filed on Oct. 30, 2009, which is incorporated herein by reference in its entirety.

BACKGROUND OF THE INVENTION

Exemplary embodiments of the present invention relate to an apparatus for correcting a duty cycle of a clock signal.

Clock signals are widely used for adjusting an operational timing in various systems and circuits. While the clock signal is used inside of the systems and circuits, the clock signal is often delayed. It is important to correct the delay for securing a reliable operation. A delay locked loop (DLL) is generally used for compensating the delay of the clock signal.

FIG. 1 is a block diagram illustrating a conventional DLL.

The conventional DLL 100 includes a phase comparison unit 110, a delay control unit 120, a variable delay unit 130, a replica delay unit 140, and a locking detection unit 150.

The replica delay unit 140 delays an internal clock signal DLLCLK and outputs a feedback clock signal FBCLK. The internal clock signal DLLCLK is an output signal of the DLL. A delay amount of the replica delay unit 140 is obtained by modeling delays of delay elements to which the internal clock signal DLLCLK outputted from the DLL is inputted. The phase comparison unit 110 compares phases of an external clock signal EXTCLK and the feedback clock signal FBCLK and outputs an up/down signal UP/DN. The delay control unit 120 controls a delay amount of the variable delay unit 130 in response to the up/down signal UP/DN. The variable delay unit 130 delays the external clock signal EXTCLK by the delay amount controlled by the delay control unit 120 and outputs the internal clock signal DLLCLK. The locking detection unit 150 generates a locking signal LOCK indicating a locked state of the DLL based on the up/down signal UP/DN.

FIG. 2 is a block diagram illustrating a conventional duty cycle correction (DCC) circuit 200 for correcting a duty cycle of the clock signals.

The conventional DCC circuit 200 includes a phase splitter unit 210, a duty cycle ratio detection unit 220, and a duty cycle correction unit 230.

The phase splitter unit 210 generates a rising clock signal RCLK and a falling clock signal FCLK based on an output clock signal CLKOUT outputted from the DCC circuit. The rising clock signal RCLK is in phase with the output clock signal CLKOUT and the falling clock signal FCLK is out of phase, i.e., has the opposite phase, with respect to the output clock signal CLKOUT. For example, the rising clock signal RCLK is enabled as a logic high level during a period where the output clock signal CLKOUT has the logic high level and the falling clock signal is enabled as the logic high level during a period where the output clock signal CLKOUT has a logic low level.

The duty cycle ratio detection unit 220 detects the duty cycle ratio of the output clock signal CLKOUT by comparing enabling periods of the rising clock signal RCLK and the falling clock signal FCLK and outputs a duty cycle code CODE<0:N>.

The duty cycle correction unit 230 corrects a duty cycle of an input clock signal CLKIN inputted to the DCC circuit in response to the duty cycle code CODE<0:N> and outputs the output clock signal CLKOUT. The duty cycle correction unit 230 may adjust a slew rate of the input clock signal CLKIN or control a voltage level of the input clock signal CLKIN for correcting the duty cycle of the input clock signal CLKIN.

The DLL shown in FIG. 1 includes a plurality of delay units inside of the variable delay unit 130 for delaying the external clock signal EXTCLK to output the internal clock signal DLLCLK. The duty cycle of the external clock EXTCLK is changed by the variable delay unit 130. Therefore, the DCC circuit 200 shown in FIG. 2 is usually included in the DLL for correcting the duty cycle of the external clock signal EXTCLK.

If the DCC circuit 200 is coupled to an input terminal of the DLL 100, it is possible to provide the DLL 100 with the external clock signal EXTCLK having a relatively accurate duty cycle. However, the change in the duty cycle caused by the variable delay unit 130 is not corrected. Meanwhile, if the DCC circuit 200 is coupled to an output terminal of the DLL, it is possible to correct the changes in the duty cycle caused by the variable delay unit 130 but the duty cycle of the external clock EXTCLK inputted to the DLL is not corrected and, therefore, the internal clock signal outputted from the DLL has an inaccurate duty cycle. Accordingly, it is desirable for an exemplary embodiment of the present invention to design a circuit having a DCC circuit coupled to both the input terminal and the output terminal of a DLL in order to secure the correct duty cycle of the external clock signal EXTCLK. However, in this case, a solution is desirable where the size of the circuit including the DLL 100 and the DCC circuit 200 is not increased undesirably.

SUMMARY OF THE INVENTION

An embodiment of the present invention is directed to an apparatus for correcting a duty cycle of a clock signal while the chip size is not increased or minimally increased.

In accordance with an embodiment of the present invention, a clock correction circuit includes a delay locked loop (DLL) configured to delay an external clock signal and to generate an internal clock signal, a first duty cycle correction (DCC) unit configured to correct a duty cycle of the external clock signal in response to a first duty cycle code, a second DCC unit configured to correct a duty cycle of the internal clock signal in response to a second duty cycle code, and a duty cycle code generation unit configured to select an output from outputs of the first and second DCC units and to generate the first and second duty cycle codes by detecting a duty cycle ratio of the selected output.

In accordance with another embodiment of the present invention, a clock correction circuit includes a first duty cycle correction (DCC) unit configured to correct a duty cycle of a first clock signal, a second DCC unit configured to correct a duty cycle of a second clock signal, and a duty cycle code generation unit configured to select an output from outputs of the first and second DCC units and to generate the first and second duty codes by detecting a duty cycle ratio of the selected output, wherein the first and second DCC units respectively perform a DCC operation in response to the first and second duty cycle codes.

In accordance with yet another embodiment of the present invention, a clock correction method for correcting a duty cycle of an external clock includes receiving the external clock, detecting a duty cycle ratio of the external clock, correcting a duty cycle of the external clock in response to the detected duty cycle ratio of the external clock and outputting a corrected external clock, generating an internal clock by delaying the corrected external clock, detecting a duty cycle ratio of the internal clock after the external clock is in a locked state, and correcting a duty cycle of the internal clock in response to the detected duty cycle ratio of the internal clock and outputting a corrected internal clock, wherein the detection of the duty cycle ratios of the external clock signal and the internal clock signal is performed by a same circuit which is used commonly to detect both duty cycle ratios.

DESCRIPTION OF SPECIFIC EMBODIMENTS

Figure 1:
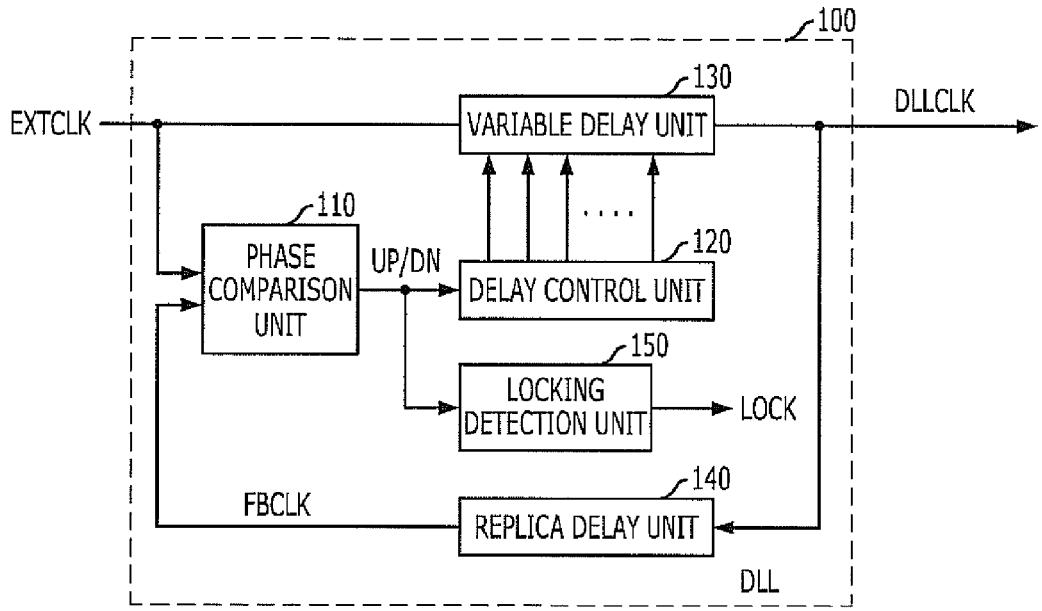
FIG. 1 is a block diagram illustrating a conventional delay locked loop (DLL).
Figure 2:
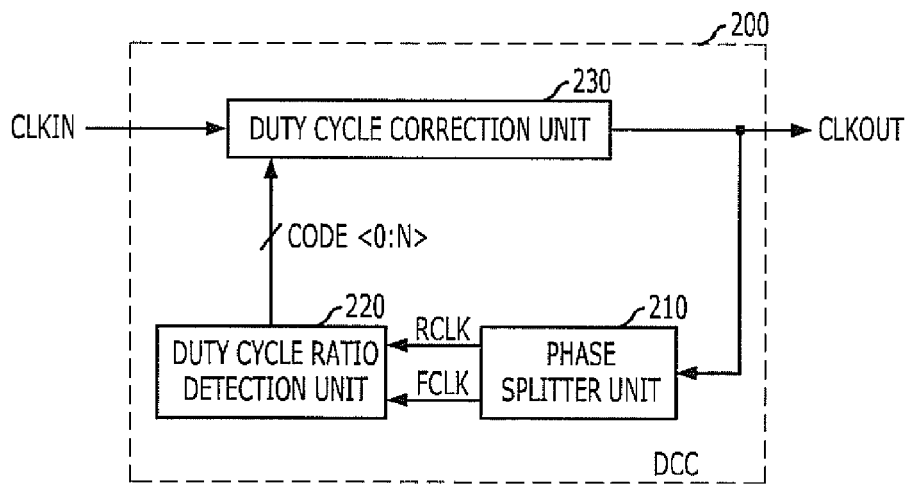
FIG. 2 is a block diagram illustrating a conventional duty cycle correction (DCC) circuit for correcting a duty cycle of the clock signals.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
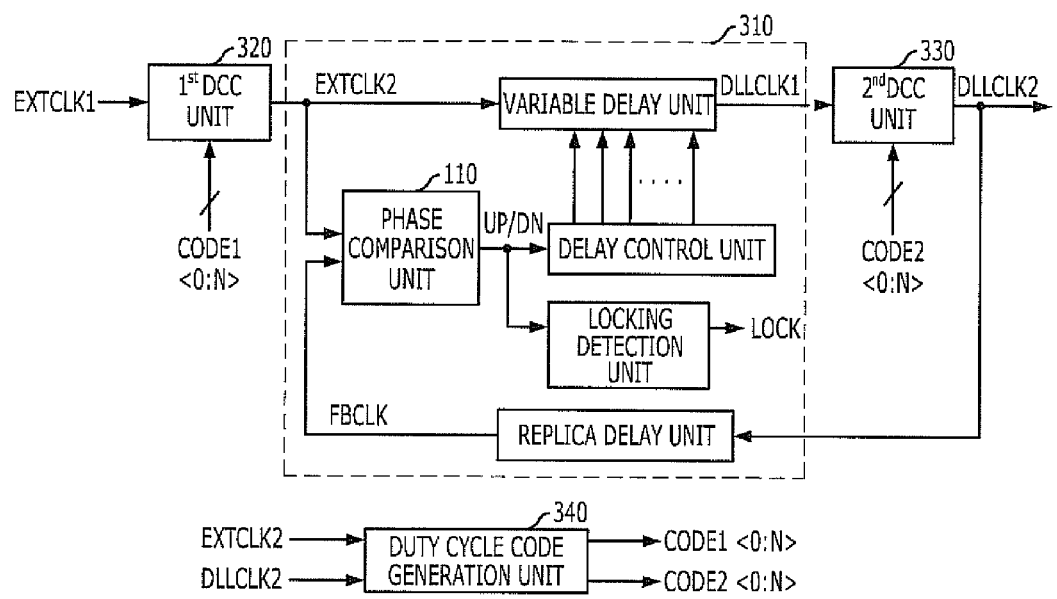
FIG. 3 is a block diagram illustrating a clock correction circuit in accordance with an embodiment of the present invention.

FIG. 3 is a block diagram illustrating a clock correction circuit in accordance with an embodiment of the present invention. The clock correction circuit includes a delay locked loop (DLL) 310, first and second duty cycle correction (DCC) units 320 and 330, and a duty cycle code generation unit 340. The first DCC unit 320 corrects a duty cycle of a first external clock signal EXTCLK1 in response to a first duty cycle code CODE1<0:N> and outputs a second external clock signal EXTCLK2. The DLL 310 delays the second external clock signal EXTCLK2 and outputs a first internal clock signal DLLCLK1. The second DCC unit 330 corrects a duty cycle of the first internal clock signal DLLCLK1 in response to a second duty cycle code CODE2<0:N> and outputs a second internal clock signal DLLCLK2. The duty code generation unit 340 detects the second external clock signal EXTCLK2 and the second internal clock signal DLLCLK2 and generates the first and second duty cycle codes CODE1<0:N> and CODE2<0:N>.

As shown in FIG. 3, the clock correction circuit in accordance with the embodiment of the present invention includes two DCC units, i.e., the first and second DCC units 320 and 330, and a single duty cycle code generation unit, i.e., the duty cycle code generation unit 340. By sharing the duty cycle code generation unit 340 for two DCC units, it is possible to decrease the size of the system that includes the clock correction circuit. Although the embodiment of the present invention illustrated in FIG. 3 includes two DCC units sharing the single duty cycle code generation unit, the same principle can be applied to cases where more than two DCC units share the single duty cycle code generation unit 340 according to a system design requirement. Furthermore, the DCC units 320 and 330 used for correcting the input and output clock signals of the DLL 310 in this embodiment also can be used in other integrated circuits and systems performing a clock duty cycle correction operation.

Figure 4:
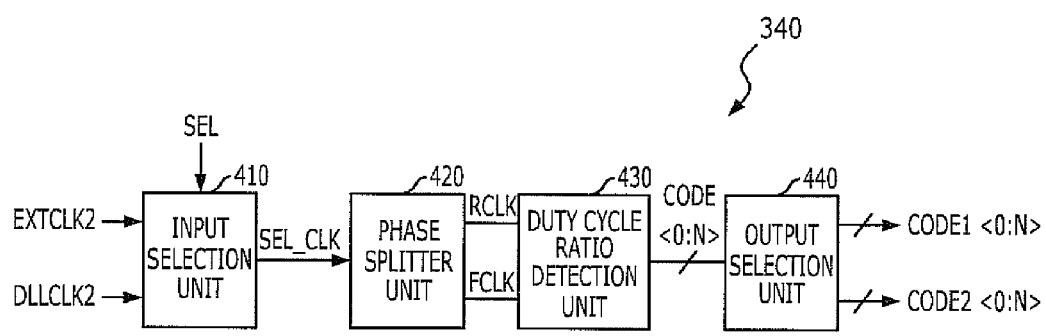
FIG. 4 is a block diagram illustrating the duty cycle code generation unit shown in FIG. 3.

FIG. 4 is a block diagram illustrating the duty cycle code generation unit 340 shown in FIG. 3.

The duty cycle code generation unit 340 according to an exemplary embodiment includes an input selection unit 410, a phase splitter unit 420, a duty cycle ratio detection unit 430, and an output selection unit 440.

The input selection unit 410 according to an exemplary embodiment selects one of the second external clock signal EXTCLK2 and the second internal clock signal DLLCLK2 in response to a selection signal SEL and outputs the selected clock signal as a selected clock signal SEL_CLK. For example, the input selection unit 410 may select the first external clock signal EXTCLK2 when the selection signal SEL has a logic low level and select the second internal clock signal DLLCLK2 when the selection signal SEL has a logic high level.

The phase splitter unit 420 according to an exemplary embodiment generates a rising clock signal RCLK and a falling clock signal FCLK based on the selected clock signal SEL_CLK. The rising clock signal RCLK is in phase with the selected clock signal SEL_CLK and the falling clock signal FCLK is out of phase, i.e., has the opposite phase, with respect to the selected clock signal SEL_CLK. For example, the rising clock signal RCLK may be enabled as a logic high level during a period where the selected clock signal SEL_CLK has the logic high level and the falling clock signal may be enabled as the logic high level during a period where the selected clock signal SEL_CLK has a logic low level.

The duty cycle ratio detection unit 430 according to an exemplary embodiment detects the duty cycle ratio of the selected clock signal SEL_CLK by comparing enabling periods of the rising clock signal RCLK and the falling clock signal FCLK and outputs a duty cycle code CODE<0:N>.

The output selection unit 440 according to an exemplary embodiment outputs the duty cycle code CODE<0:N> as one of the first and second duty codes CODE1<0:N> and CODE2<0:N> in response to the selection signal SEL. For example, the output selection unit 440 may output the duty cycle code CODE<0:N> as the first duty cycle code CODE1<0:N> when the selection signal SEL has the logic low level. The output selection unit 440 may output the duty cycle code CODE<0:N> as the second duty cycle code CODE2<0:N> when the selection signal SEL has the logic high level.

According to an exemplary embodiment, a locking signal LOCK output by the LOCKING DETECTION UNIT of the DLL 310 that indicates a locked state of the DLL 310 is used as the selection signal SEL. In this case, the first DCC unit 320 corrects the duty cycle of the first external clock signal EXTCLK1 and outputs the second external clock signal EXTCLK2 to the DLL 310 before the DLL 310 is locked. After the DLL 310 locks, the second DCC unit 330 corrects the duty cycle of the first internal clock signal DLLCLK1 after being locked by the DLL 310.

Besides the structure shown in FIG. 4, the duty cycle code generation unit 340 according to an exemplary embodiment can be implemented by any reasonably suitable structure selecting one of the second external clock signal EXTCLK2 and the second internal clock signal DLLCLK2 and selectively generating the duty cycle code based on the selected clock signal.

Figure 5:
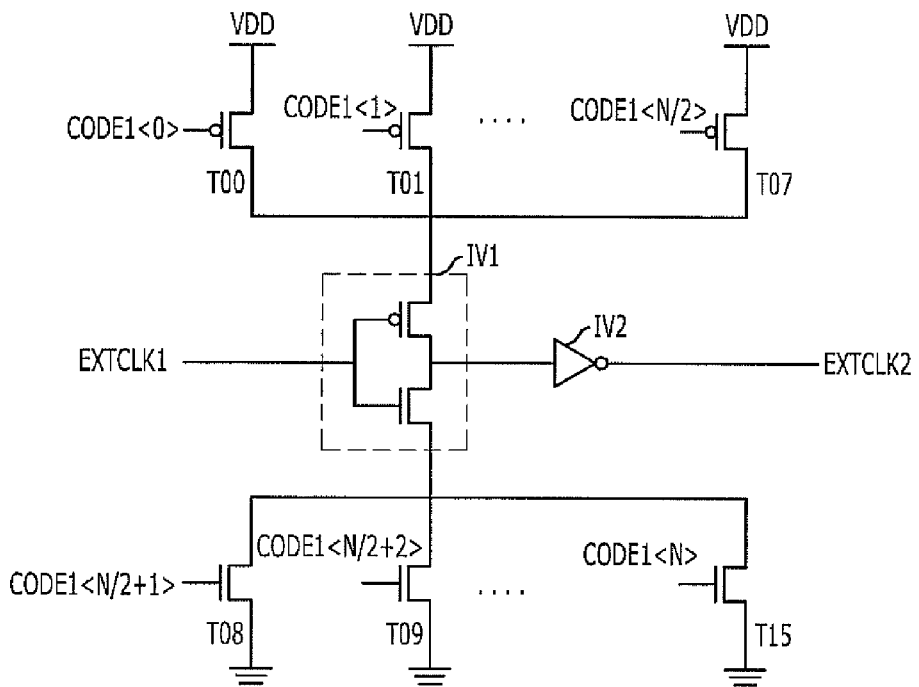
FIG. 5 is a schematic circuit diagram of the first duty cycle correction (DCC) unit shown in FIG. 3.

FIG. 5 is a schematic circuit diagram of the first DCC unit 320 shown in FIG. 3.

The first DCC unit 320 according to an exemplary embodiment includes two inverters INV1 and INV2 delaying the first external clock signal EXTCLK1 and a plurality of transistors T00 to T15 controlling pull up/down driving power of the first inverter INV1. The transistors T00 to T15 are controlled by the first duty cycle code CODE1<0:N>. Therefore, the first DCC unit 320 corrects the duty cycle of the first external clock signal EXTCLK1 by controlling the pull up/down driving power of the first inverter INV1, i.e., adjusting a slew rate of the first external clock signal EXTCLK1. It is also possible to implement the first DCC unit 320 with different structures according to other exemplary embodiments of the present invention. For example, a circuit increasing/decreasing a voltage level of the first external clock signal EXTCLK1 may be used instead for correcting a duty cycle of the first external clock signal EXTCLK1.

The second DCC unit 330 may also be implemented with the circuit shown in FIG. 5. In this case, the two inverters INV1 and INV2 delay the first internal clock signal DLLCLK1 and the transistors T00 to T15 are controlled by the second duty cycle code CODE2<0:N>.

Figure 6:
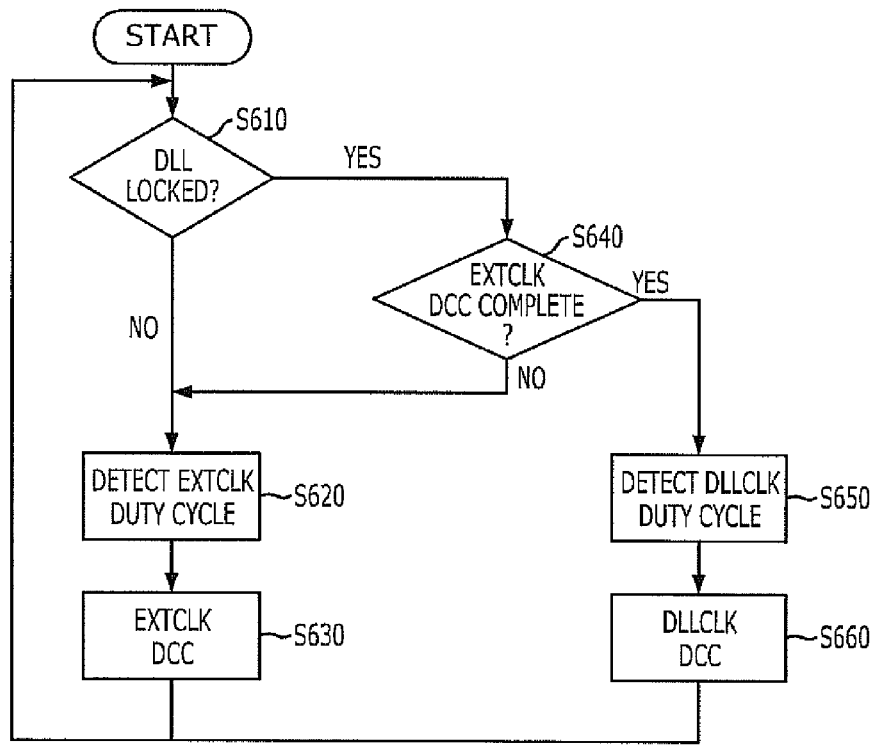
FIG. 6 is a flow chart illustrating an operation of the clock correction circuit of FIG. 3.

FIG. 6 is a flow chart illustrating an operation of the clock correction circuit of FIG. 3 according to an exemplary embodiment of the invention.

First, a determination is made as to whether or not the locking state of the DLL 310 has been detected (S610). When the DLL 310 is not in the locked state, the duty cycle of the second external clock signal EXTCLK2 is detected (S620) and corrected (S630). After the DLL 310 is determined to be in the locked state, a determination is made as to whether or not a duty cycle correction operation to the second external clock signal EXTCLK2 has been completed (S640). When the duty cycle correction operation to the second external clock signal EXTCLK2 has not been completed, the duty cycle correction operation to the second external clock signal EXTCLK2 is continued (S620 and S630). After the DLL 310 is in the locked state and the duty cycle correction operation to the second external clock signal EXTCLK2 has been completed, a duty cycle correction operation to the second internal clock signal DLLCLK2 is performed (S650 and S660). Whether the duty cycle correction DCC operation is performed to the second external clock signal EXTCLK2 or the second internal clock signal DLLCLK2 is determined by the selection signal SEL. For example, the selection signal SEL has the logic low level when the steps of S620 and S630 are performed and has the logic high level when the steps of S650 and S660 are performed.

The clock correction circuit in accordance with the embodiment of the present invention corrects the duty cycles of an input clock signal inputted to the DLL and an output clock signal outputted from the DLL where the chip size is not increased or minimally increased by sharing the duty cycle code generation unit. That is, the clock correction circuit decreases the size of a system using a plurality of DCC circuits by generating duty cycle codes in a single duty code generation unit.

While the present invention has been described with respect to the specific embodiments, it will be apparent to those skilled in the art that various changes and modifications may be made without departing from the spirit and scope of the present invention as defined in the following claims.

What is claimed is:

1. A clock correction circuit, comprising:
   a delay locked loop (DLL) configured to delay an external clock signal and to generate an internal clock signal;
   a first duty cycle correction (DCC) unit configured to correct a duty cycle of the external clock signal in response to a first duty cycle code;
   a second DCC unit configured to correct a duty cycle of the internal clock signal in response to a second duty cycle code; and
   a duty cycle code generation unit configured to select an output from outputs of the first and second DCC units and to generate the first and second duty cycle codes by detecting a duty cycle ratio of the selected output.

2. The clock correction circuit of claim 1, wherein the duty cycle code generation unit is configured to generate the first duty cycle code based on the output of the first DCC unit before the DLL is in a locked state and to generate the second duty cycle code based on the output of the second DCC unit after the DLL is in the locked state.

3. The clock correction circuit of claim 1, wherein the duty cycle code generation unit includes:
   an input selection unit configured to select the selected one of the outputs of the first and second DCC units;
   a phase splitter unit configured to generate a rising clock signal and a falling clock signal based on the selected output;
   a duty cycle ratio detection unit configured to compare the rising clock signal and the falling clock signal and to generate a duty cycle code; and
   an output selection unit configured to output the duty cycle code as one of the first duty cycle code and the second duty cycle code.

4. The clock correction circuit of claim 1, wherein the first and the second DCC units are configured to perform a DCC operation by respectively adjusting slew rates of the external clock signal and the internal clock signal.

5. The clock correction circuit of claim 4, wherein the first DCC unit includes an inverter configured to receive the external clock signal and a plurality of transistors configured to control a driving power of the inverter in response to the first duty cycle code.

6. The clock correction circuit of claim 4, wherein the second DCC unit includes an inverter configured to receive the internal clock signal and a plurality of transistors configured to control a driving power of the inverter in response to the second duty cycle code.

7. The clock correction circuit of claim 1, wherein the DLL includes:
   a phase comparison unit configured to compare an output signal of the first DCC unit and a feedback clock signal;
   a delay control unit configured to control a first delay amount in response to an output of the phase comparison unit;
   a variable delay unit configured to delay the external clock signal by the first delay amount and to output the internal clock signal;
   a replica delay unit configured to delay the internal clock signal by a second delay amount and to output the feedback clock signal; and
   a locking detection unit configured to generate a locking signal indicating a locked state of the DLL in response to an output of the phase comparison unit.

8. The clock correction circuit of claim 7, wherein the duty cycle code generation unit is configured to selectively receive the outputs of the first and second DCC units and to selectively output the first and second duty cycle codes in response to the locking signal.

9. A clock correction circuit, comprising:
a first duty cycle correction (DCC) unit configured to correct a duty cycle of a first clock signal;
a second DCC unit configured to correct a duty cycle of a second clock signal; and
a duty cycle code generation unit configured to select an output from outputs of the first and second DCC units and to generate first and second duty cycle codes by detecting a duty cycle ratio of the selected output,
wherein the first and second DCC units are configured to respectively perform a DCC operation in response to the first and second duty cycle codes.

10. The clock correction circuit of claim 9, wherein the duty cycle code generation unit includes:
an input selection unit configured to select the selected one of the outputs of the first and second DCC units;
a phase splitter unit configured to generate a rising clock signal and a falling clock signal based on the selected output;
a duty cycle ratio detection unit configured to compare the rising clock signal and the falling clock signal and to generate a duty cycle code; and
an output selection unit configured to output the duty cycle code as one of the first duty cycle code and the second duty cycle code.

11. The clock correction circuit of claim 9, wherein the first and the second DCC units are configured to perform the DCC operation by respectively adjusting slew rates of the first and second clock signals.

12. A clock correction method for correcting a duty cycle of an external clock, comprising:
receiving the external clock;
detecting a duty cycle ratio of the external clock;
correcting a duty cycle of the external clock in response to the detected duty cycle ratio of the external clock and outputting a corrected external clock;
generating an internal clock by delaying the corrected external clock;
detecting a duty cycle ratio of the internal clock after the external clock is in a locked state; and
correcting a duty cycle of the internal clock in response to the detected duty cycle ratio of the internal clock and outputting a corrected internal clock,
wherein the detection of the duty cycle ratios of the external clock signal and the internal clock signal is performed by a same circuit which is used commonly to detect both duty cycle ratios.

* * * * *